(12) United States Patent
Hantsch

(10) Patent No.: US 11,913,987 B2
(45) Date of Patent: Feb. 27, 2024

(54) AUTOMATED TEST EQUIPMENT COMPRISING A DEVICE UNDER TEST LOOPBACK AND AN AUTOMATED TEST SYSTEM WITH AN AUTOMATED TEST EQUIPMENT COMPRISING A DEVICE UNDER TEST LOOPBACK

(71) Applicant: Advantest Corporation, Tokyo (JP)

(72) Inventor: Andreas Hantsch, Heidelberg (DE)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 17/720,980

(22) Filed: Apr. 14, 2022

(65) Prior Publication Data

US 2022/0236318 A1 Jul. 28, 2022

Related U.S. Application Data

(63) Continuation of application No. PCT/EP2020/083412, filed on Nov. 25, 2020.

(51) Int. Cl.
*G01R 31/28* (2006.01)
*G01R 31/317* (2006.01)

(52) U.S. Cl.
CPC ..... *G01R 31/2834* (2013.01); *G01R 31/2822* (2013.01); *G01R 31/2844* (2013.01); *G01R 31/31716* (2013.01)

(58) Field of Classification Search
CPC ............ G01R 31/2822; G01R 31/3025; G01R 31/318572; G01R 31/31907; G01R 35/005; G01R 31/28; G01R 1/067; G01R 1/07385; G01R 31/2834; G01R 31/2844; G01R 31/31716; G01R 31/31905;
(Continued)

(56) References Cited

U.S. PATENT DOCUMENTS 4,646,299 A * 2/1987 Schinabeck ...... G01R 31/31922
702/120
6,268,735 B1 * 7/2001 Craig ..................... G01R 23/20
324/613

(Continued)

*Primary Examiner* — Vinh P Nguyen

(57) ABSTRACT

An embodiment is an automated test equipment (ATE) for testing a device under test (DUT) which is connected to the ATE via a load board. The ATE comprises a stimulus module, a measurement module, a loopback, a first switch, a second switch, and a load board interface. The load board interface comprises a first radio frequency port and a second radio frequency port. The first and second radio frequency ports are configured to be coupled to the respective ports of the load board. The first switch is configured to couple the first radio frequency port to the stimulus module in a first switching state of the first switch and the second switch is configured to couple the second radio frequency port to the measurement module in a first switching state of the second switch. Further, the first switch is configured to couple the first radio frequency port to a first end of the loopback in a second switching state of the first switch and the second switch is configured to couple the second radio frequency port to a second end of the loopback in a second switching state of the second switch. When the first and second switches are in their respective second switching state, a loopback signal path is formed between the first and second radio frequency ports.

21 Claims, 12 Drawing Sheets

(58) Field of Classification Search
CPC .......... G01R 31/3191; G01R 31/31917; G01R 31/318307; G01R 31/318555; G01R 31/2856; G01R 31/318314; G01R 31/26; G01R 31/307; G01R 31/311; G06F 11/263; G06F 11/26; G06F 8/40; G06F 11/261; G06F 11/2733; G08C 17/02; H03L 7/07
See application file for complete search history.

(56) References Cited

U.S. PATENT DOCUMENTS

| | | | | |
|---|---|---|---|---|
| 7,313,496 | B2* | 12/2007 | Ishida | G01R 31/31709 |
| | | | | 702/120 |
| 9,041,421 | B2* | 5/2015 | Peng | G01R 31/2822 |
| | | | | 324/750.01 |
| 9,806,828 | B2* | 10/2017 | Wilson | H04B 17/17 |
| 10,110,325 | B2* | 10/2018 | Chen | H04B 3/46 |
| 10,320,494 | B2* | 6/2019 | Chung | G01R 31/2822 |
| 11,334,459 | B2* | 5/2022 | Bautista | G06F 11/3466 |
| 2006/0146318 | A1 | 7/2006 | Adam et al. | |
| 2006/0184332 | A1 | 8/2006 | Ishida et al. | |
| 2016/0204881 | A1 | 7/2016 | Chung et al. | |

* cited by examiner

View From Top

View From Bottom

_(1)_

AUTOMATED TEST EQUIPMENT COMPRISING A DEVICE UNDER TEST LOOPBACK AND AN AUTOMATED TEST SYSTEM WITH AN AUTOMATED TEST EQUIPMENT COMPRISING A DEVICE UNDER TEST LOOPBACK

CROSS-REFERENCES TO RELATED APPLICATIONS

This application is a continuation of copending International Application No. PCT/EP2020/083412, filed Nov. 25, 2020, which is incorporated herein by reference in its entirety.

DESCRIPTION

Embodiments according to the invention are related to automated test equipments comprising a device under test loopback for testing a device under test which is connected to the automated test equipment via a load board. Further embodiments according to the invention are related to automated test systems comprising an automated test equipment and a load board for testing a device under test.

Integrated radio frequency (RF) devices often consist of a transmitter and a receiver. An output of the transmitter and an input of the receiver are often connected to independent RF pins of the integrated RF device. In an automated test, those pins are connected to individual ports of the automated test equipment (ATE). So the transmitter and receiver of the integrated RF device or the device under test (DUT) are tested independently and/or individually by stimulus and measurement modules or resources of the ATE.

According to a prior art example, the ATE contains stimulus and measurement resources or modules. The resources of the ATE are connected to unidirectional tester ports of the ATE. Those ports are configured to connect to a device under test (DUT), so the ATE may stimulate the DUT receiver or measure signals transmitted from the DUT transmitter.

According to another example, similar to the example before, the ATE modules, e.g. the stimulus and measurement resources, are connected to the tester ports of the ATE. Using additional switches, each tester port may be connected either to a stimulus or a measurement resource of the ATE, enabling a bi-directional usage of the ports. The DUT could be connected to the ATE bi-directional in one way, or the other way around. That is, for example, the transmitter of the DUT may be connected to a first port of the ATE and the receiver of the DUT may be connected to a second port of the ATE. Or the transmitter and receiver of the DUT may be swapped, so that the receiver of the DUT may be connected to the first port of the ATE and the transmitter of the DUT may be connected to the second port of the ATE.

There is a need for an ATE which performs tests more efficiently by utilizing the available resources.

An embodiment of the present invention is an automated test equipment (ATE) for testing a device under test (DUT) which is connected to the ATE via a load board. The ATE comprises a stimulus module, a measurement module, a loopback, a first switch, a second switch, and a load board interface. The load board interface comprises a first radio frequency port and a second radio frequency port. The first and second radio frequency ports are configured to be coupled to the respective ports of the load board. The first switch is configured to couple the first radio frequency port to the stimulus module in a first switching state of the first switch and the second switch is configured to couple the second radio frequency port to the measurement module in a first switching state of the second switch. Further, the first switch is configured to couple the first radio frequency port to a first end of the loopback in a second switching state of the first switch and the second switch is configured to couple the second radio frequency port to a second end of the loopback in a second switching state of the second switch. When the first and second switches are in their respective second switching state, a loopback signal path is formed between the first and second radio frequency ports.

The above-described embodiment of an ATE allows for the ATE to test the receiver of the DUT with the stimulus module of the ATE and/or to test the transmitter of the DUT with the measurement module of the ATE or allows a DUT self-test depending on the switching states of the first and second switches. In a DUT self-test or loopback test the transmitter of the DUT transmits a signal to the receiver of the DUT, in order to stimulate the receiver of the DUT. A typical frequency of a test signal in a loopback test is between 1 MHz and 100 GHz. Thus, providing the ATE with the loopback enables utilizing internal self-test resources of the DUT when the DUT is coupled to the ATE via the load board, without requiring an external loopback or a loopback within the load board.

In other words, when the first and second switches are in their respective second switching states, a direct loopback connection or a loopback signal path is formed or introduced between the RF ports. The loopback signal path allows to connect the transmitter of the DUT to the receiver of the DUT, enabling DUT loopback testing. So the internal resources of the DUT may be used for self-testing the DUT. The loopback or the loopback signal path may operate in both directions.

A self-test of the DUT could be executed in 'mission mode', supported by the functionalities of the transmitter or receiver of the DUT, or by using built-in self-test functionalities of the DUT. The internal resources of the DUT might have additional functionality or better performance parameters than the ATE enabling more thorough tests. When the loopback or the loopback signal path is not used, the ATE stimulus and measurement modules or resources may still be connected to the DUT via the switches and may be used for executing additional tests.

In a preferred embodiment, the load board interface comprises pogo pins configured to connect digital and power supply pins to the load board. The pogo pins may be used for their improved durability over other electrical contact forms, and for the resilience of their electrical connection to mechanical shocks and vibrations.

According to embodiments, the first and second radio frequency ports of the load board interface are coaxial ports. RF coaxial cables are used for minimizing signal loss and interference. An advantage of coaxial over other types of radio transmission lines is that in an ideal coaxial cable the electromagnetic field carrying the signal exists only in the space between the inner and outer conductors. This allows, for example, a coaxial cable to be installed next to metal objects without power losses that would occur in other types of transmission lines. A coaxial cable also provides protection of the signal, for example, from an external electromagnetic interference. Coaxial connectors are designed to maintain a coaxial form across the connection and have the same impedance as the attached cable. Due to the skin effect, the RF signal is only carried by deflating at higher frequencies and does not penetrate to the connector body.

In an embodiment, the loopback comprises a transmission line directly connecting the first switch to the second switch. The loopback comprising a transmission line directly connecting the first switch to the second switch is configured to connect the receiver of the DUT to the transmitter of the DUT over the transmission line, if the first and the second switch are in the second switching state. That is, the signal of the transmitter of the DUT is directly measured by the receiver of the DUT, enabling a DUT self-test.

In an embodiment, the loopback comprises at least one power adjusting element. The power of the signal transmitted by the transmitter of the DUT may differ from the input range of the receiver of the DUT, therefore a power adjusting element may be used to adapt the power ranges. The power delivered by the transmitter of the DUT may be adjusted by the power adjusting element to a level that is suitable for the receiver of the DUT.

In an embodiment, the loopback comprises at least one of an attenuator and an amplifier as the power adjusting element. As the physical characteristics of the transmitter and the receiver of the DUT differs, a power adjusting element, such as an attenuator and/or an amplifier, may be used. For example, in RF applications the transmitter of the DUT tend to be a high power transmitter, while the receiver of the DUT tend to be a highly sensitive receiver. With an attenuator the power of the signal provided by the transmitter of the DUT may attenuated to a level that is suitable for the receiver of the DUT. On the contrary, when the input power range of the receiver of the DUT is higher than the power of the signal provided by the transmitter of DUT, an amplifier may amplify the signal to a level that is suitable for the receiver of the DUT.

In an embodiment, the loopback is a first loopback permitting signal transmission between the first and second radio frequency ports in a first direction and the ATE comprises a second loopback permitting signal transmission between the first and second radio frequency ports in a second direction opposite to the first direction. The first switch is configured to couple the first radio frequency port to a first end of the second loopback in a third switching state of the first switch, and the second switch is configured to couple the second radio frequency port to a second end of the second loopback in a third switching state of the second switch. The loopback signal path is formed between the first and second radio frequency ports when the first and second switches are in the respective third switching state. Such embodiments permit a bi-directional operation via the loopback and the second loopback. This permits a bi-directional operation in case of loopbacks permitting unidirectional signal transmission only, such as a loopback including a power amplifier element. The second loopback may also comprise power adjusting elements, which may permit unidirectional signal transmission, such as in a direction opposite to the signal transmission direction of the first loopback.

According to embodiments, the ATE comprises at least one coupler configured to couple out parts of a signal from the loopback signal path and to provide the coupled out part of the signal to the measurement module of the ATE. The coupler may be a directional coupler. The coupler may enable the ATE to receive, store and analyze the parts of the data coupled out by the coupler. For example, if the tested DUT would fail one of the tests, the signal transmitted by the DUT may be still measured and/or collected and/or analyzed by the ATE. In addition, such a coupler enables analyzing the loopback signal by the ATE simultaneously with the loopback test.

In an embodiment, a first coupler is configured to couple out part of a signal from a portion of the loopback signal path between the power adjusting element and the first radio frequency port and to provide the coupled out part of the signal to the measurement module. A second coupler is configured to couple out part of the signal from a portion of the loopback signal path between the power adjusting element and the second radio frequency port and to provide the coupled out part of the signal to the measurement module. In other words, the first and second couplers or directional couplers are configured to couple out part of the signal before and after the power adjusting elements and to provide the coupled out parts of the signal to the measurement module of the ATE. This enables the ATE to collect and/or store and/or analyze the transmitted signal of the transmitter of the DUT before and after the power adjusting element. For example, if the tested DUT would fail one of the tests, the signals transmitted by the DUT may be still measured and/or collected and/or analyzed by the ATE.

In an embodiment, the ATE comprises a coupler switch which is configured to couple the first coupler or the second coupler to the measurement module. In case the ATE comprises more than one coupler or directional coupler, a coupler switch may be used to choose which coupler is connected to the measurement module of the ATE, enabling reading out and/or storing and/or analyzing coupled out parts of the signal timely sequenced, using one coupler after each other.

In an embodiment, the first switch is configured to couple the first radio frequency port to the measurement module in a fourth switching state of the first switch and the second switch is configured to couple the second radio frequency port to the stimulus module in a fourth switching state of the second switch. The fourth switching states of the first and second switches enable the ATE to stimulate the receiver of the DUT with a stimulation module of the ATE and/or to measure the transmitted signal of the DUT by a measurement module of the ATE, enabling a bi-directional operation of the ATE.

According to embodiments, the ATE comprises a third switch configured to couple the first switch to the stimulus module when the first switch is in the first switching state of the first switch and to couple the second switch to the stimulus module when the second switch is in the fourth switching state of the second switch. Further, the ATE comprises a fourth switch configured to couple the second switch to the measurement module when the second switch is in the first switching state of the second switch and to couple the first switch to the measurement module when the first switch is in the fourth switching state of the first switch. In other words, the third switch is configured to couple the stimulus module with the first switch or with the second switch, and the fourth switch is configured to couple the measurement module to the first switch or to the second switch. The stimulus module of the ATE may stimulate a receiver of the DUT via the first or the second RF port, depending on the switching states of the switches, and also the measurement module of the ATE may measure a transmitted signal of the transmitter of the DUT over the first or second RF port depending on the switching states of the switches. Therefore, by using the third and the fourth switch a bi-directional operation of the DUT is enabled.

A further embodiment comprises an automated test system comprising an automated test equipment and a load board. The load board is configured to be mechanically and electrically docked to the load board interface of the ATE and the load board comprises at least one socket configured to accommodate a DUT. The connectors of the socket configured to be connected to the DUT are connected to the first and second radio frequency ports of the ATE via the load board. The load board of the automated test system enables a high speed switching of DUTs and is adapted to a production environment. Further, the applied load board may be switched out swiftly to a new load board, compatible with a different type of DUTs. Therefore using a load board in the automated test system enables testing different DUTs fast and convenient in a production environment.

It should be noted that features and functionalities of the automated test system may be supplemented by any of the features, functionalities and details which are described herein with respect to the automated test equipment, both individually and taken in combination.

Further, it should be noted that the numbering of the switches and the numbering of the switching states are chosen arbitrary and used as a distinction from the already mentioned switches or switching states respectively.

In the following, embodiments of the present disclosure are described in more detail with reference to the Figures in which.

In the following, different inventive embodiments and aspects of an automated test equipment (ATE) will be described. Also, further embodiments will be defined by the enclosed claims. It is to be noted that the same or similar elements in the Figures are provided with the same reference signs and that a repeated description of such elements and the functionality thereof is omitted. Thus, the description of an element with a specific reference sign in connection with one of the Figures also applies for the corresponding element in connection with other Figures.

It should be noted that any embodiments as defined by the claims may be supplemented by any of the details, features and functionalities described herein. Also, the embodiments described herein may be used individually, and may also optionally be supplemented by any of the details, features and functionalities included in the claims. It should also be noted that individual aspects described herein may be used individually or in combination. Thus, details may be added to each of said individual aspect without adding details to another one of said aspects. It should also be noted that the present disclosure describes explicitly or implicitly features useable in an automated test equipment or in an automated test system. Thus, any of the features described herein may be used in the context of an automated test equipment or an automated test system.

The invention will be understood more fully from the detailed description given below and from the accompanying drawings of embodiments of the invention which, however, should not be taken to limit the invention to the specific embodiments described, but are for explanation and understanding only.

Figure 1:
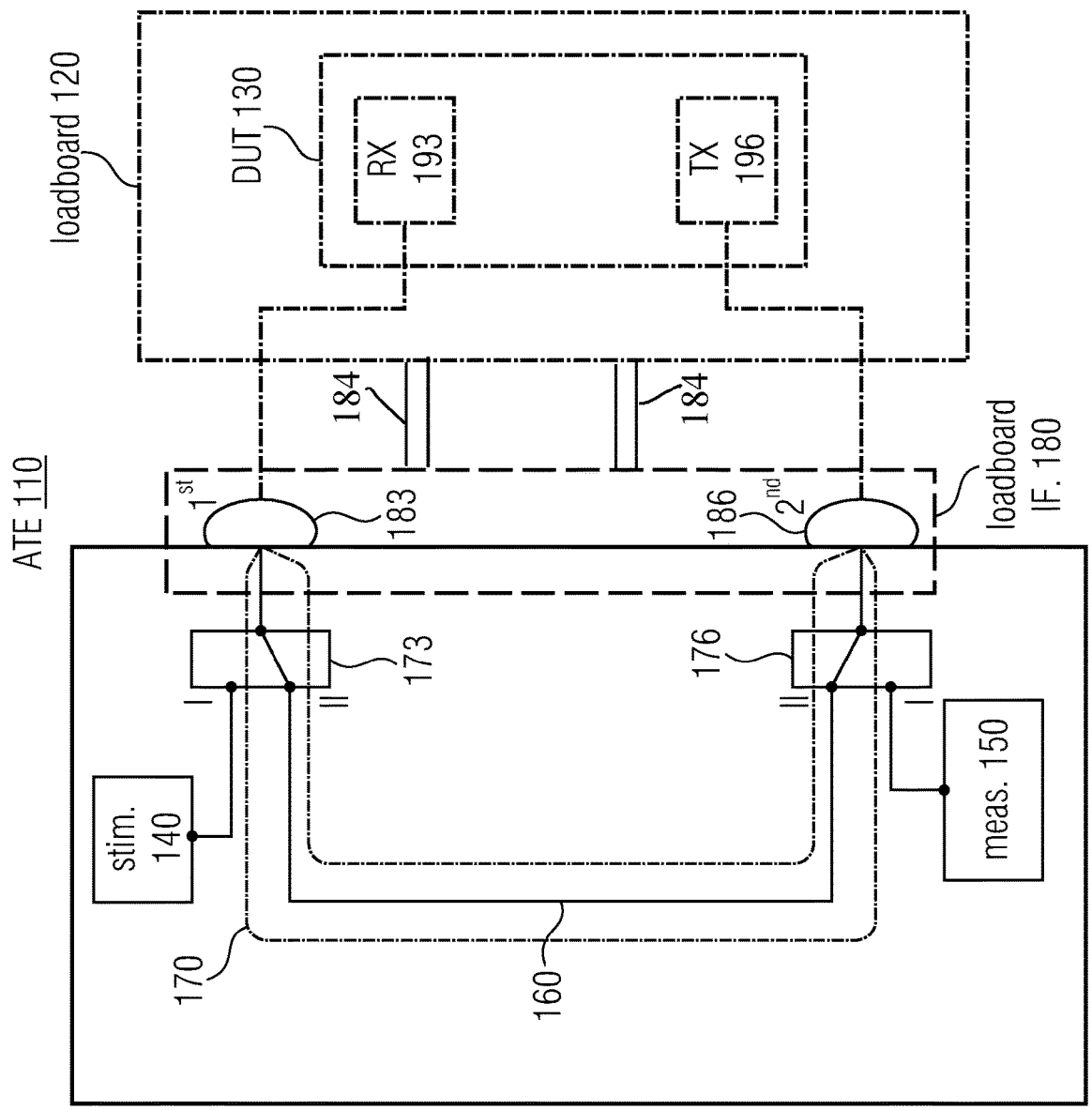
FIG. 1 shows a schematic representation of an automated test equipment with a device under test loopback connected to a device under test via a load board, according to an embodiment.

FIG. 1 shows a schematic representation of an embodiment of an automated test equipment (ATE) 110 with a loopback, configured to test a device under test (DUT) 130 connected to the ATE 110 via a load board 120. The ATE 110 comprises a stimulus module 140, a measurement module 150, a loopback 160, a first switch 173, a second switch 176 and a load board interface 180. The load board interface further comprises a first radio frequency port 183 and a second radio frequency port 186.

The ATE 110 is connected to the DUT 130 via the load board 120. The load board 120 is coupled to the ATE 110 over the load board interface 180. The load board interface 180 comprises, for example, pogo pins 184 configured to connect digital data pins and power supply pins to the load board 120, and the first and second radio frequency ports 183, 186, such as coaxial ports, to be coupled with the respective ports of the load board 120.

Within the ATE 110 the first radio frequency port 183 is coupled to the first switch 173 and the second radio frequency port 186 is coupled to the second switch 176. The first switch 173 is coupled to the first radio frequency port 183, to the stimulus module 140, and to a first end of the loopback 160. The second switch 176 is coupled to the second radio frequency port 186, to the measurement module 150 and to a second end of the loopback 160. Unless otherwise stated, the term coupled as used herein means that the corresponding elements are connected, such as directly, to each other so that signal transmission may take place therebetween.

The first switch 173 is configured to couple the first radio frequency port 183 with the stimulus module 140 in a first switching state or to couple the first radio frequency port 183 to a first end of the loopback 160 in a second switching state. The second switch 176 is configured to couple the second radio frequency port 186 to the measurement module 150 in a first switching state or to couple the second radio frequency port 186 to a second end of the loopback 160 in a second switching state. In the Figures, switching states of the switches are indicated by Roman numerals.

When the first and second switches 173, 176 are in the respective second switching state, a loopback signal path 170 is formed between the first and second radio frequency ports 183, 186. To be more specific, the loopback signal path 170 is formed by loopback 160 and signal lines coupling high frequency port 183 to first switch 173 and high frequency port 186 to second switch 176.

Generally, the loopback signal paths described herein may be regarded as being formed by a respective loopback and signal lines connecting respective switches to the high frequency ports. Generally, the loopback and the signal lines may comprise any transmission line or waveguide suitable for high frequency signal transmission, such as microstrip lines formed by a conductive trace and a nearby ground plane, microstrip lines formed by a conductive trace sandwiched between two nearby conductive traces, or coplanar lines.

The above-described setup makes it possible for the ATE 110 to test the receiver 193 of the DUT 130 by stimulating the receiver 193 using the stimulus module 140 of the ATE 110 when the first switch 173 is in the first switching state. Further, it allows for the ATE 110 to measure the signal from the transmitter 196 of the DUT 130 using the measurement module 150 of the ATE 110 if the second switch 176 is in the first switching state. This setup also allows for the ATE 110 to couple the transmitter 196 of the DUT 130 with the receiver 193 of the DUT 130 using the loopback signal path 170 if both switches, the first switch and the second switch 173, 176, are in the respective second switching state. In this state loopback tests may be executed and executing loopback tests may save ATE resources and/or enable the ATE 110 to utilize the additional functionalities and/or the good performance parameters of the DUT 130 resulting in a more thorough test.

Figure 2:
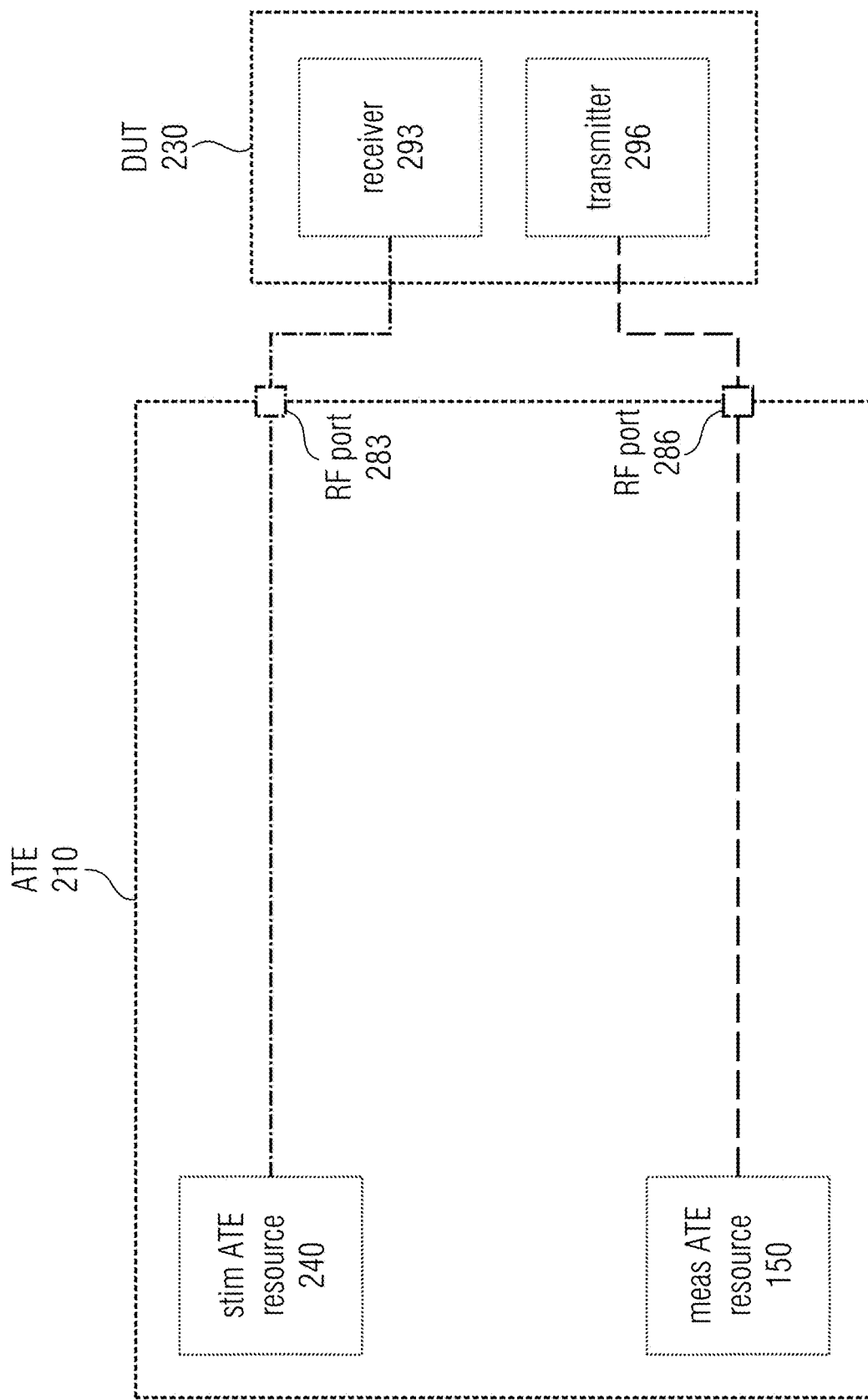
FIG. 2 shows a schematic representation of an automated test equipment connected to a device under test, according to the prior art.

FIG. 2 shows a schematic representation of a prior art ATE 210 coupled to a DUT 230. The ATE 210 comprises a stimulus module 240, a measurement module 250, a first RF port 283 and a second RF port 286. Within the ATE 210 the stimulus module 240 is coupled to the first radio frequency port 283 and a measurement module 250 is coupled to the second radio frequency port 286. The DUT 230 comprises a receiver 293 and a transmitter 296. The receiver 290 of the DUT 230 is coupled to the stimulus module 240 of the ATE 210 over the first radio frequency port 283 of the ATE 210. The transmitter 296 of the DUT 230 is coupled to the measurement module 250 of the ATE 210 over the second radio frequency port 286 of the ATE 210. The stimulus module 240 of the prior art ATE 210 is configured to test the receiver 293 of the DUT 230 by stimulating the receiver 293 which is coupled to the stimulus module 240 of the ATE 210 over the first radio frequency port 283. The measurement module 250 of the ATE 210 is configured to test the transmitter 296 of the DUT 230 by measuring the signal transmitted by the transmitter 296, which is coupled to the measurement module 250 of the ATE 210 over to a second radio frequency port 286.

The internal resources of the DUT 230 may have additional functionalities or better performance parameters when compared to the ATE 210. The prior art ATE 210 does not permit effective utilization of such available resources of the DUT.

Figure 3:
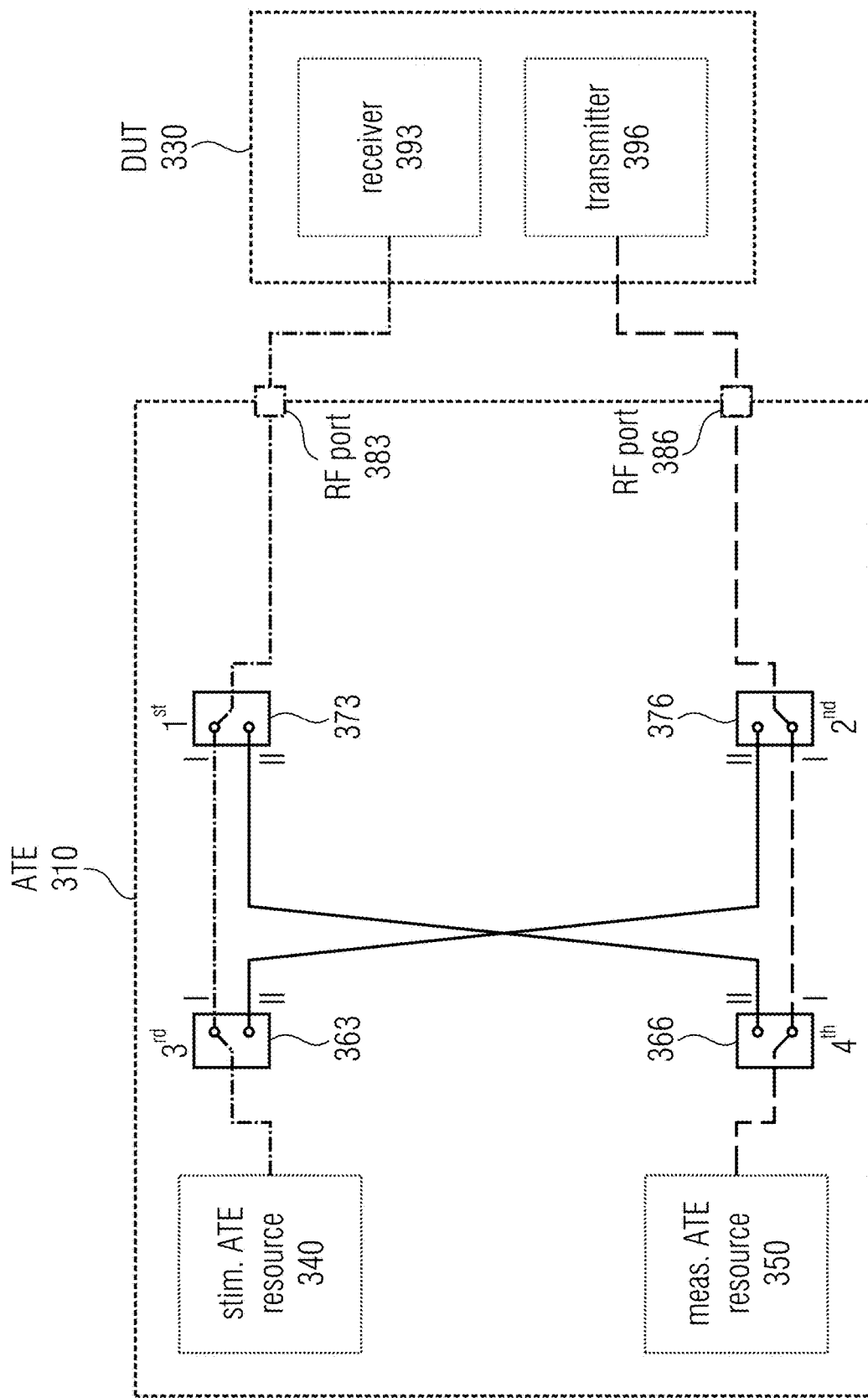
FIG. 3 shows a schematic representation of a bi-directional automated test equipment connected to a device under test, according to the prior art.

FIG. 3 shows a schematic representation of a bi-directional prior art ATE 310 coupled to a DUT 330. Similar to the prior art ATE 210 of FIG. 2, the prior art ATE 310 comprises a first radio frequency port 383, a second radio frequency port 386, a stimulus module 340 and a measurement module 350. Further, the prior art ATE 310 comprises additional four switches, when compared to the prior art ATE 210: a first switch 373, a second switch 376, a third switch 363, and a fourth switch 366.

The ATE 310 is coupled to the DUT 330, which comprises a receiver 393 and a transmitter 396, over the first and second RF ports 383, 386. The receiver 393 is coupled to the first radio frequency port 383. The transmitter 396 is coupled to the second radio frequency port 386. Analogously to the ATE 210, the stimulus and receiver modules 340, 350 of the ATE 310 are configured to test the respective receiver and transmitter modules 393, 396 of the DUT 330.

Within the ATE 310 the first radio frequency port 383 is coupled to the first switch 373, while the second radio frequency port 386 is coupled to the second switch 376. Both, the first switch 373 and the second switch 376 are coupled to the third switch 363 and to the fourth switch 366. The third switch 363 is coupled to the stimulus module 340. The fourth switch 366 is coupled to the measurement module 350.

Within the ATE 310 the stimulus and the measurement modules 340, 350 are configured to be coupled to the first or to the second radio frequency port 383, 386 depending on the switching states of the additional four switches 363, 366, 373, 376.

The stimulus module 340 may be coupled to the first radio frequency port 383 when the first and third switches 363, 373 are both in their first switching states. The stimulus module 340 may be coupled to the second radio frequency port 386 when the third switch and the second switch 363, 376 are both in their second switching state.

The measurement module 350 may be coupled to the second radio frequency port 386 when the fourth switch and the second switch 366, 376 are both in their first switching state. The measurement module 350 may be coupled to the first radio frequency port 383 when the fourth switch and the first switch 366, 373 are both in their second switching state.

The additional four switches 363, 366, 373, and 376 enable a bi-directional operation of the first and second ports 383, 386, that is the receiver 393 may be connected to the first radio frequency port 383 and the transmitter 396 of the DUT 330 may be connected to the second radio frequency port 386, as shown in FIG. 3, if the four switches are in the first switching state. Moreover, the receiver 393 may be connected to the second radio frequency port 386 and the transmitter 396 may be connected to the first radio frequency port 383 if the switches are in the respective second switching state. Thus, the ports are bi-directional and connection of the transmitter 396 and the receiver 393 of the DUT 330 may be swapped.

Compared to the prior art ATE 210, the prior art ATE 310 permits a bi-directional operation, but neither of the ATE 210 nor the ATE 310 provides any support for utilizing available DUT resources, such as self-test resources of the DUT.

Figure 4:
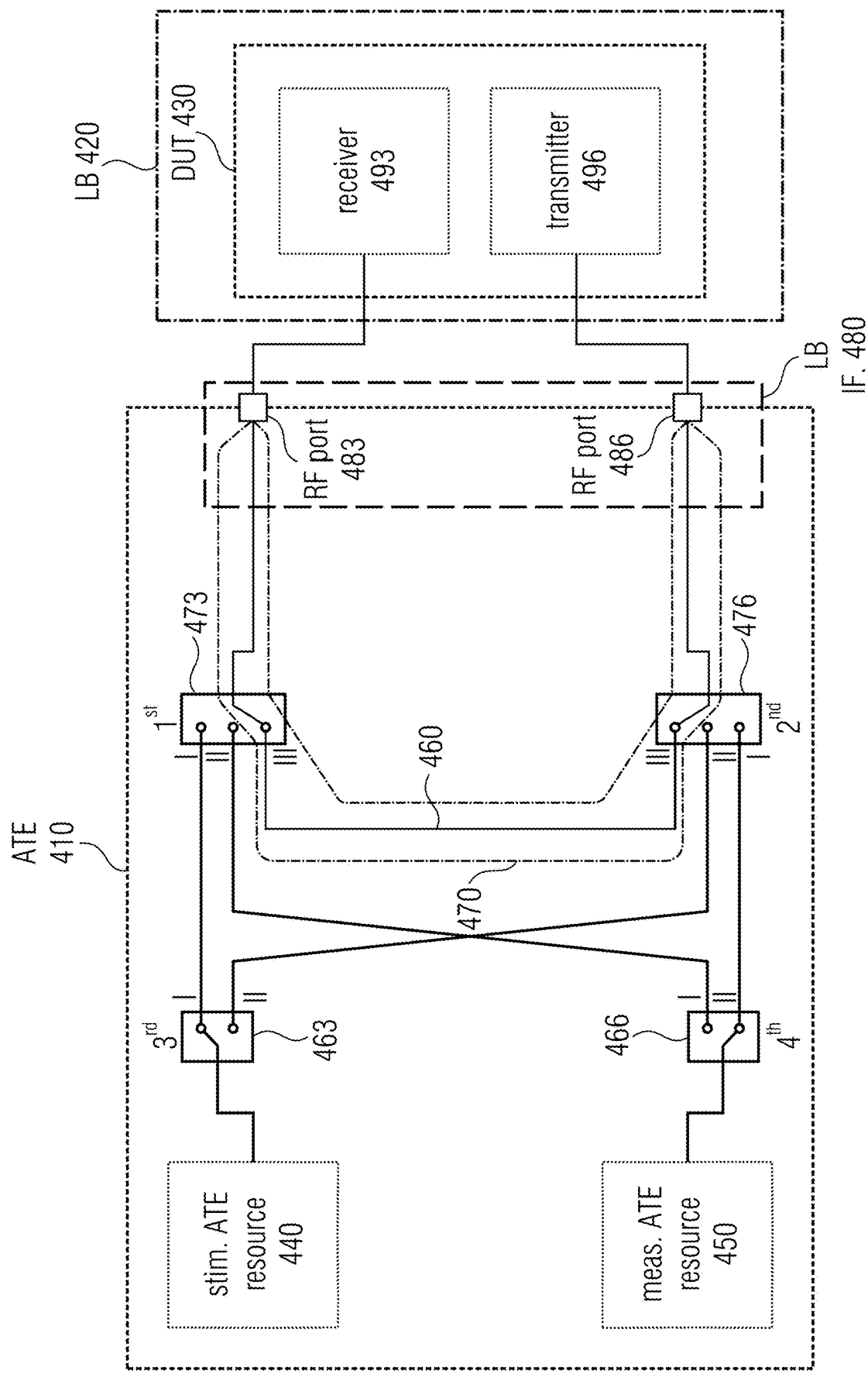
FIG. 4 shows a schematic representation of a bi-directional automated test equipment with a device under test loopback connected to a device under test via a load board, according to an embodiment.

FIG. 4 shows a schematic representation of an embodiment of a bi-directional ATE 410 comprising a loopback 460. The ATE 410 is coupled to a DUT 430 via a load board 420 over the load board interface 480 of the ATE 410. The ATE 410 is a sophisticated version of the ATE 110 of FIG. 1 and comprises four switches, a first switch 473, a second 476, a third switch 463 and a fourth switch 476. The four switches 466 permit a bi-directional operation of the ATE 410.

The first radio frequency port 483 is coupled to the first switch 473, the second radio frequency port 486 is coupled to the second switch 476. Both, the first switch 473 and the second switch 476 are coupled to the third switch 463 and to the fourth switch 466. The first switch 473 is further coupled to the second switch 476 via loopback 460.

Within the ATE 410 the stimulus module 440 is coupled to the third switch 463 and the measurement module 450 is coupled to the fourth switch 466. The stimulus and the measurement modules 440, 450 are configured to be coupled to the first or to the second radio frequency port 483, 486 depending on the switching states of the four switches 463, 466, 473, 476.

The stimulus module 440 may be coupled to the first radio frequency port 483 when the first and third switches 463, 473 are both in their first switching states. The stimulus module 440 may be coupled to the second radio frequency port 486 when the third switch and the second switch 463, 476 are both in their second switching state.

The measurement module 450 may be coupled to the second radio frequency port 486 when the fourth switch and the second switch 466, 476 are both in their first switching state. The measurement module 450 may be coupled to the first radio frequency port 483 when the fourth switch and the first switch 466, 473 are both in their second switching state.

Due to the four switches 463, 466, 473, 476 of the ATE 410 the first and second radio frequency ports 483 and 486 of the load board interface 480 are bi-directional, that is either one of the receiver 493 and the transmitter 496 of the DUT 430 may be connected to one of the first and second radio frequency ports 483, 486 and the other one of the receiver 493 and the transmitter 496 may be connected to the other one of the first and second radio frequency ports 483, 486, depending on the switching states of the four switches. The stimulus module 440 is configured to test the receiver 493 of the DUT and the measurement module 450 is configured to test the transmitter 496 of the DUT 430 based on a signal transmitted by the transmitter 496 and received at the measurement module 450.

If both, the first and the second switch 473, 476 are in their third switching state, the first radio frequency port 483 is connected to the second radio frequency port 486 via the loopback 460 and a loopback signal path 470 is formed between the first and second RF ports 483, 486. The loopback signal 470 path enables loopback testing of the DUT 430, that is the receiver 493 of the DUT 430 is receiving the signal transmitted by the transmitter 496 of the DUT 430 via the loopback signal path 470. The loopback or the loopback signal path 470 may operate in both directions. A typical signal used in the loopback testing may have a frequency between 1 MHz and 100 GHz.

Figure 5:
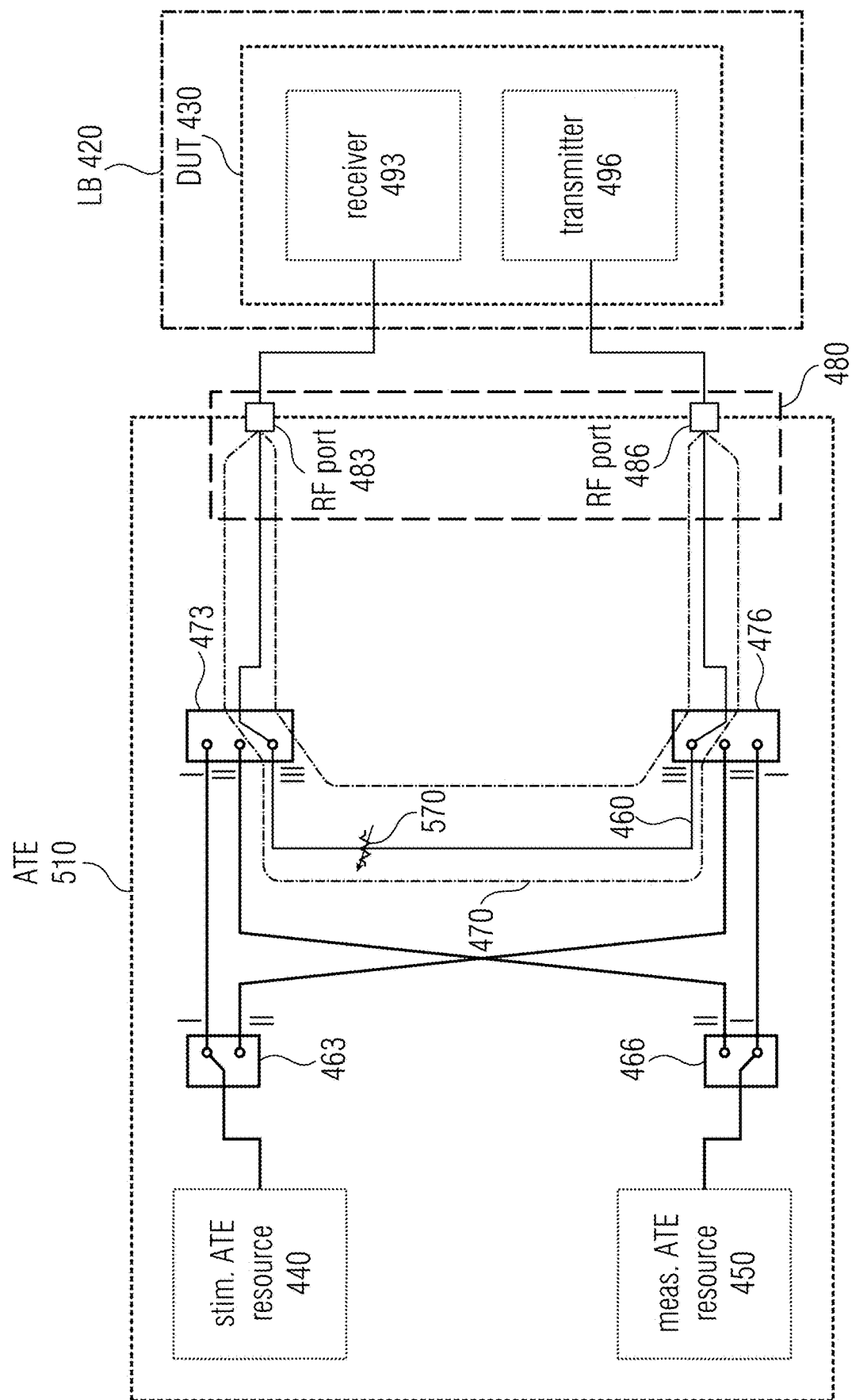
FIG. 5 shows a schematic representation of a bi-directional automated test equipment with a device under test loopback comprising an attenuator connected to a device under test via a load board, according to an embodiment.

FIG. 5 shows a schematic representation of an embodiment of a bi-directional ATE 510 with a loop back 460 comprising an attenuator 570. The ATE 510 is coupled to the DUT 430 via the load board 420. The ATE 510 corresponds to the ATE 410 shown in FIG. 4 except for the fact that loopback 460 of ATE 510 comprises an attenuator 570 while loopback 460 of ATE 410 provides a direct connection between radio frequency ports. Thus, with respect to all other elements and features reference is made to the above description with respect to FIG. 4 and a repeated description is omitted. The additional attenuator 570 may be a fixed or a variable attenuator, which may be adjusted continuously or step by step. The attenuator 570 allows to adjust an insertion loss of the loopback 460, so that the power delivered by the transmitter 496 of the DUT 430 may be attenuated to a level that is suitable for the receiver 493 of the DUT 430. The loopback signal path 470 is formed between the first and the second RF ports 483, 486 when the first and second switch 473, 476 are in their third switching state. The loopback signal path 470, comprising the attenuator 570, remains bi-directional, that is it may operate in both directions with the attenuator 570.

Figure 6:
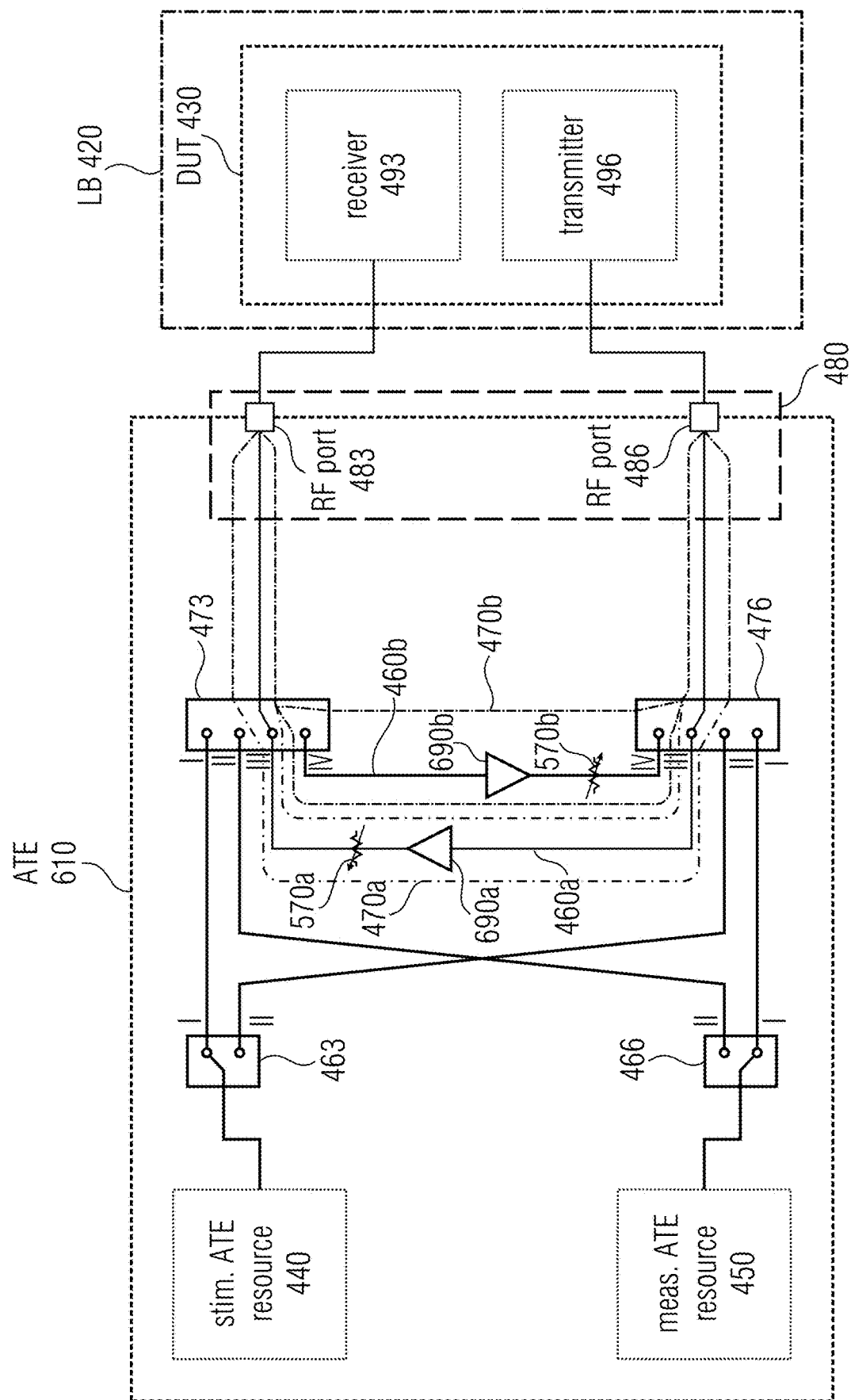
FIG. 6 shows a schematic representation of a bi-directional automated test equipment with two device under test loopbacks, each comprising an attenuator and an amplifier, connected to a device under test via a load board, according to an embodiment.

FIG. 6 shows a schematic representation of an embodiment of a bi-directional ATE 610 with two loopbacks 460a and 460b, each comprising an attenuator and an amplifier. The ATE 610 is connected to the DUT 430 via load board interface 480. In ATE 610 the first and second switches 473, 476 may be coupled to each other via either the first loopback 460a or the second loopback 460b. Both loopbacks 460a, 460b comprise an attenuator 570a, 570b and an amplifier 690a and 690b. In an alternative embodiment, one or both of the attenuators 570a, 570b may be omitted. Attenuators 570a, 570b may be fixed or variable attenuators, which may be adjusted continuously or step by step.

The attenuators 570a, 570b and/or the amplifiers 690a, 690b are examples of power adjusting elements and permit the power delivered by the transmitter 496 of the DUT 430 to be either amplified or attenuated to a level that is suitable to the receiver 493 of the DUT 430.

In this embodiment, the first switch 473 has four switching states and the second switch 475 has four switching states. A first loopback signal path 470a is formed by the first loopback 460a between the first radio frequency port 483 and the second radio frequency port 468 when the first switch and the second switch 473, 476 are both in the third switching state. Since the first loopback 460a comprises the attenuator 570a and the amplifier 690a, it permits a unidirectional signal transmission in a first direction from the second switch 475 to the first switch 437.

Since an amplifier is usually an unidirectional component, the second loopback 460b providing the second loopback signal path 470b is provided in order to permit a bi-directional operation. The second loopback signal path 470b is formed by the second loopback 460b between the first and second RF ports 483, 486 when the first switch and the second switches 473, 476 are both in their fourth switching state. The second loopback 460b comprises the second attenuator 570b and the second amplifier 690b and permits signal transmission in a second direction from the first switch 473 to the second switch 475, which is opposite to the first direction.

Figure 7:
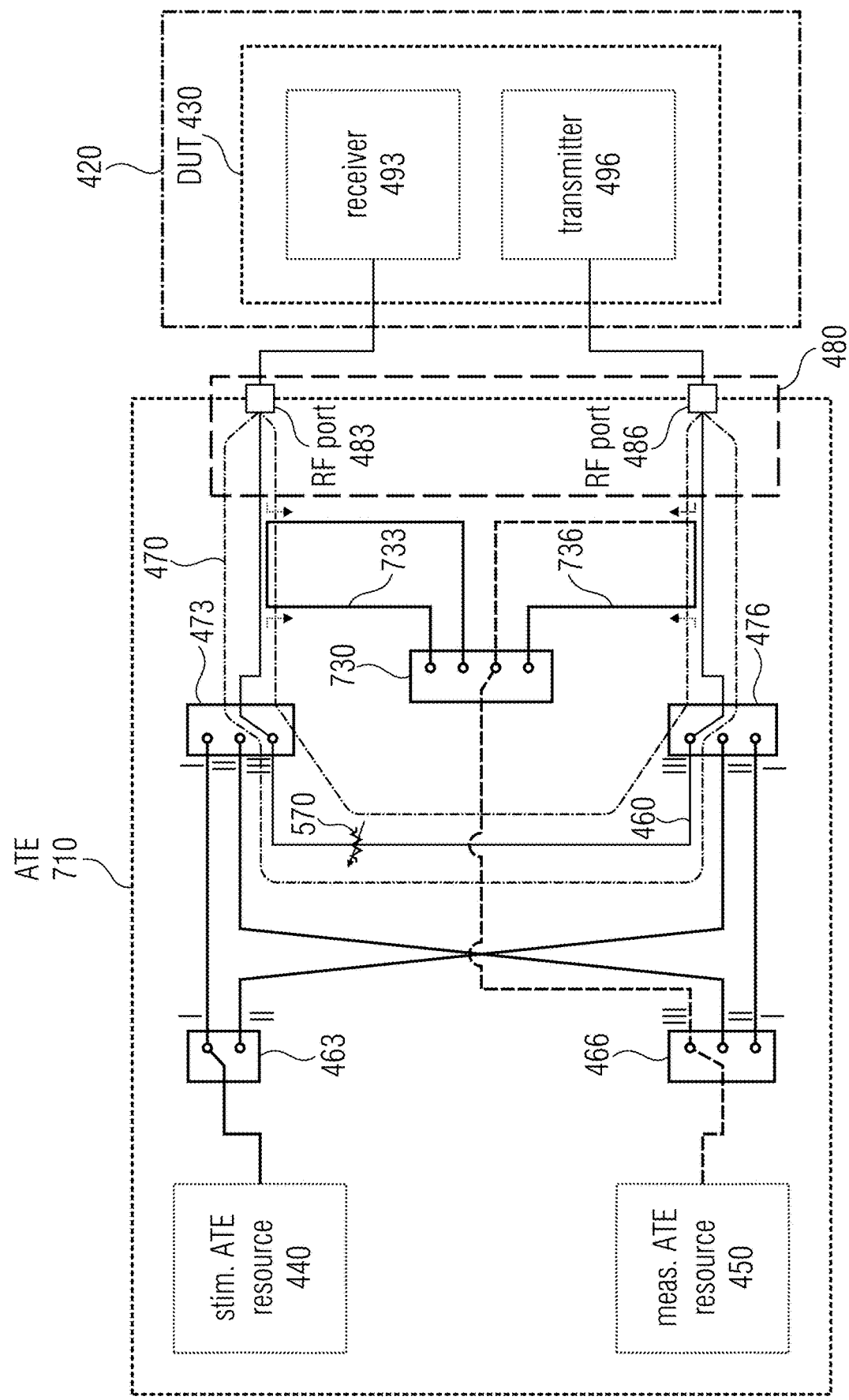
FIG. 7 shows a schematic representation of a bi-directional automated test equipment with couplers and with a device under test loopback comprising an attenuator connected to a device under test via a load board, according to an embodiment.

FIG. 7 shows a schematic representation of an embodiment of a bi-directional ATE 710 comprising loopback 460 provided with the attenuator 570 and coupler 733, 736. ATE 710 is connected to DUT 430 via load board 420. ATE 710 shown in FIG. 7 is corresponds to ATE 510 in FIG. 5 except for couplers 733, 736, coupler switch 730 and the fact that the fourth switch has a third switching state. Couplers 733, 736 are connected to coupler switch 730. The first and second couplers 733, 736 are coupled to coupler switch 330 and coupler switch 330 is further coupled to fourth switch 466. When fourth switch 466 is in the third switching state, it couples measurement module 450 with coupler switch 730.

The first and second couplers 733, 736 are configured to couple out part of a signal from a portion of the loopback signal path 470 which is formed between the first and second RF ports 483, 486. The coupler switch 730 is configured to couple the first coupler 733 or the second coupler 736 to the measurement module 450 when the fourth switch 466 is in the third switching state.

The couplers 733, 736 may be directional couplers each configured to couple out part of the signal propagating in first direction or a second direction. Coupler switch may be configured to couple fourth switch 466 to a specific one of four coupler terminals depending on which part of the signal is to be coupled out to the measurement module.

Thus, couplers 733, 736 enable the ATE 710 to receive and/or store and/or analyze parts of the signal propagating on the loopback signal path 470. For example, if the tested DUT 430 would fail one of the tests, the transmitted signals of the DUT 430 may be still measured and/or collected and/or analyzed by the ATE 710.

In other words, by adding couplers 733, 736, the loopback signal may be coupled out and fed into the measurement module 450 of the ATE 710. The couplers 733, 736 enable analyzing the loopback signal of the loopback signal path 470 by the ATE 710 simultaneously to the loopback test. The loopback signal could also be coupled out at other coupling paths of the couplers using switch 730. For example, the couplers may be directional couplers. The loopback 460 may be implemented with or without the attenuator 570.

Figure 8:
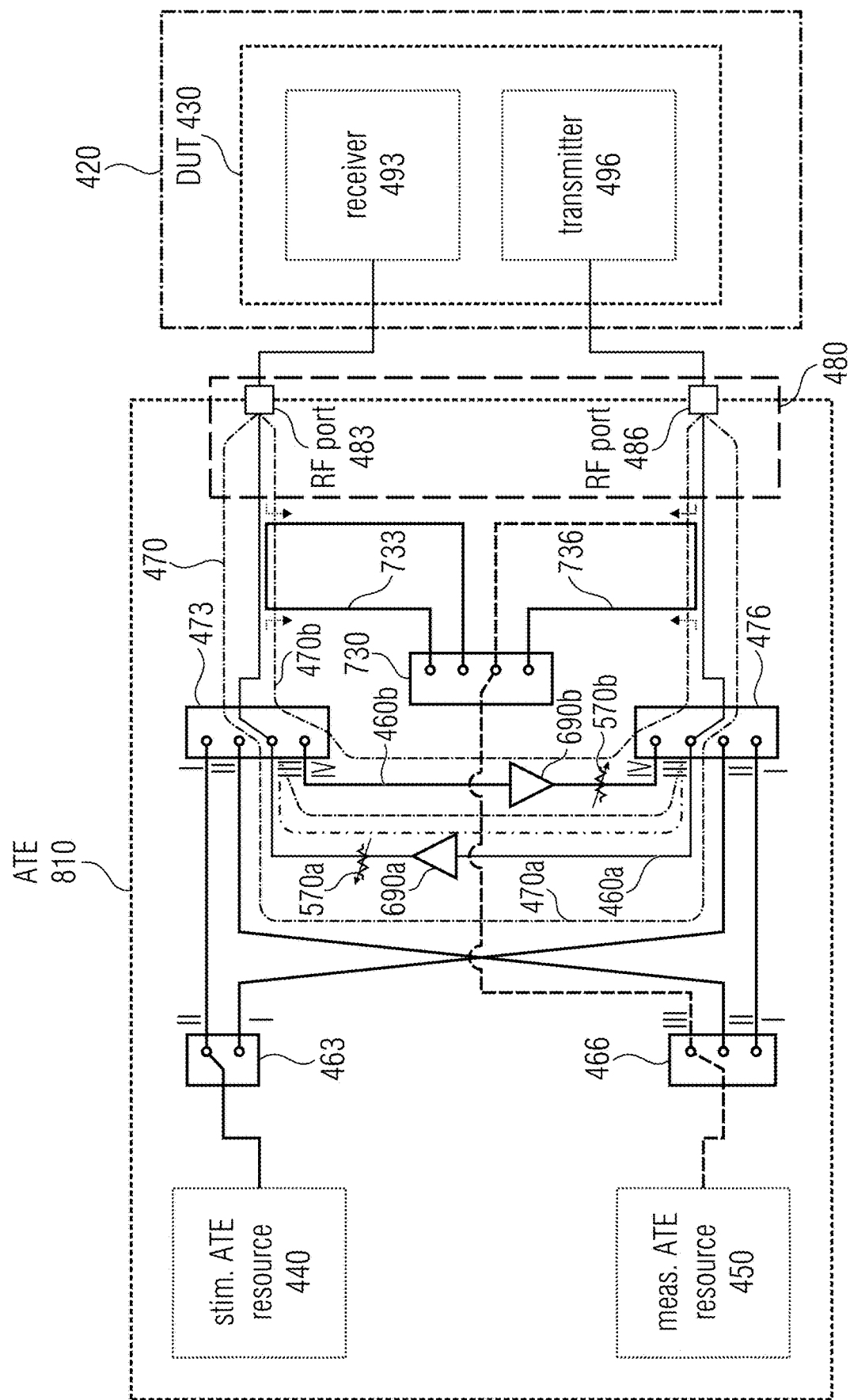
FIG. 8 shows a schematic representation of a bi-directional automated test equipment with couplers and with two device under test loopbacks, each comprising an attenuator and an amplifier, connected to a device under test via a load board, according to an embodiment.

FIG. 8 shows a schematic representation of a bi-directional ATE 810 connected to a DUT 430 via a load board 420, wherein ATE 810 comprises couplers 733, 736 and two loopbacks 460a, 460b, each comprising an attenuator 570 and an amplifier 690. Thus, ATE 810 corresponds to ATE 610 shown in FIG. 6 with the exception that couplers 733, 736 and coupler switch 730 are provided and that fourth switch 466 comprises an additional third switching state. Both, the first coupler and the second coupler 733, 736 are coupled to the coupler switch 730, which is further coupled to the fourth switch 466. When the fourth switch 466 is in the third switching state it couples measurement module 450 with coupler switch 730 so that the signal coupled out from the loopback path, either 470a or 470b, is transferred to the measurement module 450.

The first and second switches 473 and 476 permit switching the first loopback 460a into the loopback path so that loopback path 470a is formed or switching the second loopback 460b into the loopback path so that loopback path 470b is formed. Each of the loopbacks 460a, 460b comprises an unidirectional amplifier 690a, 690b and, therefore, forms an unidirectional loopback. The first loopback 460a permits a signal transmission in a first direction, while the second loopback 460b permits a signal transmission in a second direction, opposite to the first direction. In addition, each of the loopbacks 460a, 460b comprises an attenuator 570a, 570b. In other embodiments, one or both attenuators 570a, 570 may be omitted.

The first and second couplers 733, 736 are configured to couple out part of a signal from a portion of the first or second loopback signal paths 470a, 470b. In examples, couplers 733, 736 are configured to couple out part of a signal from a common portion of the first and second loopback signal paths 470a, 470b, such as the signal line connecting high frequency port 483 to first switch 473 and the signal line connecting high frequency port 486 to the second switch 476. The coupler switch 730 is configured to couple one of the terminals of the first coupler 733 or one of the terminals of the second coupler 736 to the measurement module 450 when the fourth switch 466 is in the third switching state. Thus, signals propagating in the respective loopback signal path in different directions may be coupled to the measurement module 450.

The added couplers 733, 736 might be directional couplers enabling the ATE 810 to receive and/or store and/or analyze parts of the signal coupled out by the couplers 733, 736. For example, if the tested DUT 430 would fail one of the tests, the transmitted signals of the DUT 430 may be still measured and/or collected and/or analyzed by the ATE 810.

While two couplers are shown in FIGS. 7 and 8 in connection with specific loopbacks, it is to be noted that a different number of couplers, such as only one coupler, may be provided. In addition, one or more couplers may be used in connection with any of the loopbacks disclosed herein. In FIGS. 7 and 8, the couplers are provided at portions of the loopback path between the respective radio frequency port and the first or second switch. In other embodiments, one or more couplers may be provided to couple out part of the signal directly from the respective loopback, i.e. from the signal path between the first and second switches.

Figure 9:
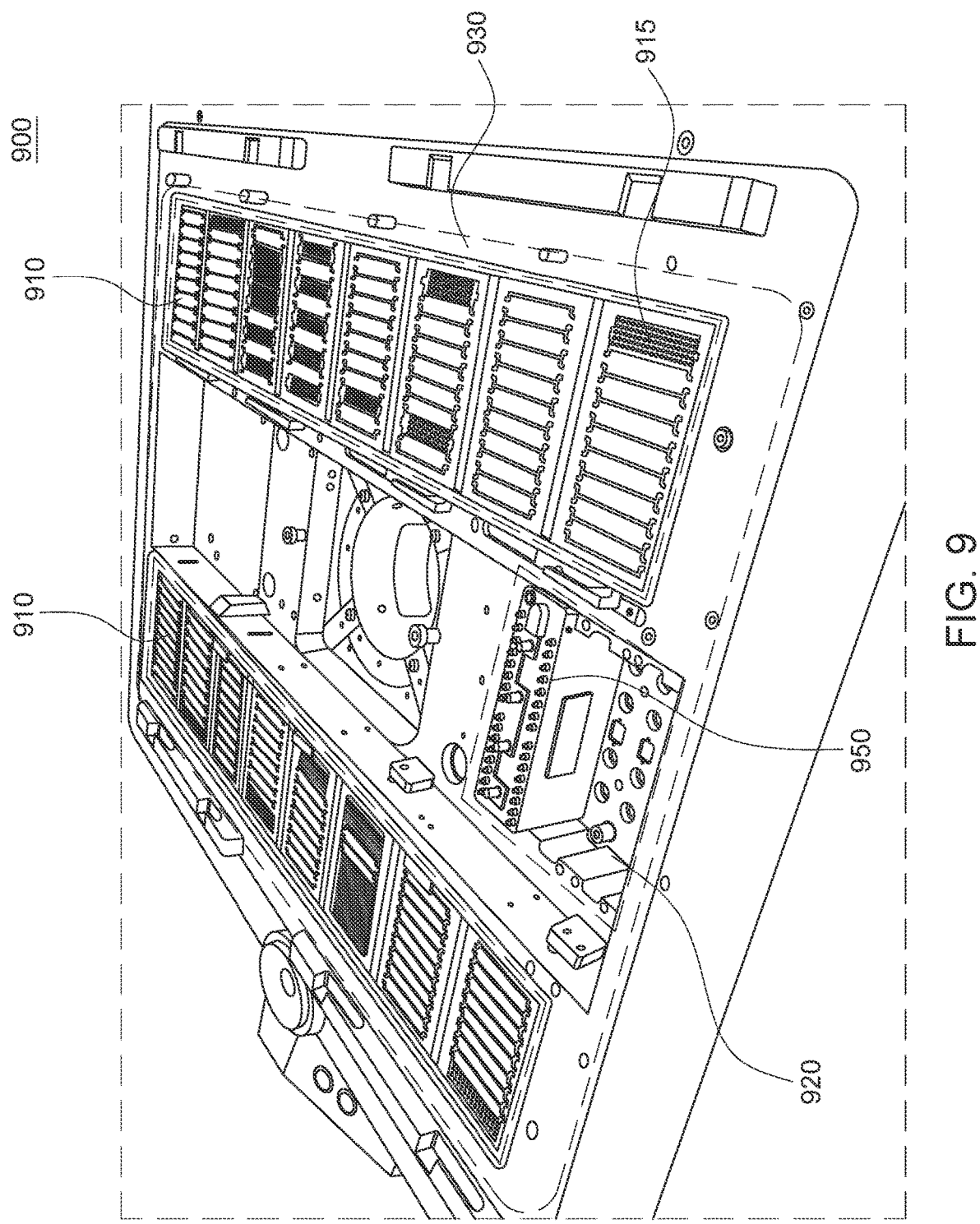
FIG. 9 shows a view of a test head of an automated test equipment comprising a load board interface, according to an embodiment.

FIG. 9 shows a view of a test head 900 of an ATE, such as the ATE in any of the embodiments described herein. The test head 900 and, therefore, the ATE comprises a load board interface 930 comprising coaxial radio frequency interfaces 920 and digital and power supply interfaces 910. A load board may be mechanically and electrically docked to the load board interface 930. The digital and power supply interface 910 comprises digital data pins and power supply pins 915. The digital data pins and power supply pins 915 are configured to connect directly to a load board printed circuit board (PCB) shown in FIG. 11, for example, via pogo-pins. The coaxial RF interface 920 comprises one or more radio frequency interface modules 950. The radio frequency interface module 950 is configured to be connected with the load board via coaxial cable interface, in order to transmit and/or receive radio frequency signals.

Figure 10:
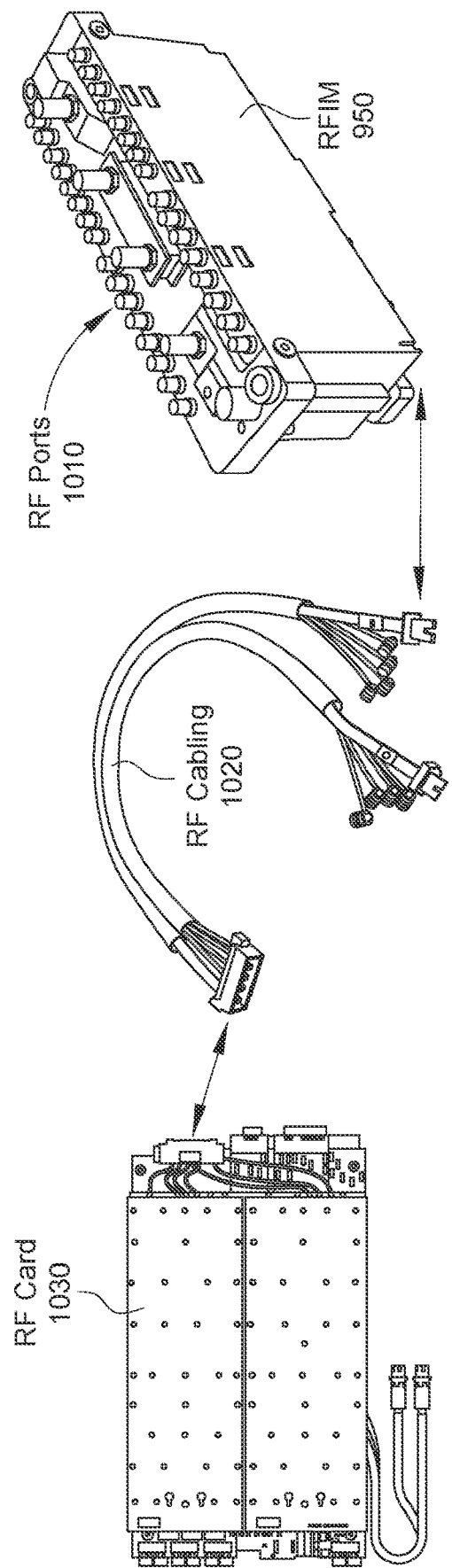
FIG. 10 shows views of parts of an automated test equipment connecting a radio frequency interface module to the radio frequency card of the automated test equipment.

FIG. 10 shows an example of a radio frequency interface module 950 comprising radio frequency ports 1010, which are, for example, coaxial cable ports. The radio frequency interface module (RFIM) 950 may be connected to a radio frequency card 1030 of the ATE via radio frequency cabling 1020. Generally, the DUT loopback may be implemented within an appropriate portion of the ATE, such as in test head 900, in radio frequency interface module 950 or in RF card 1030. Since the DUT loopback is implemented in the ATE, any change or modification in the load board or additional components of the load board are not necessary for the implementing of the DUT loopback.

Figure 11A:
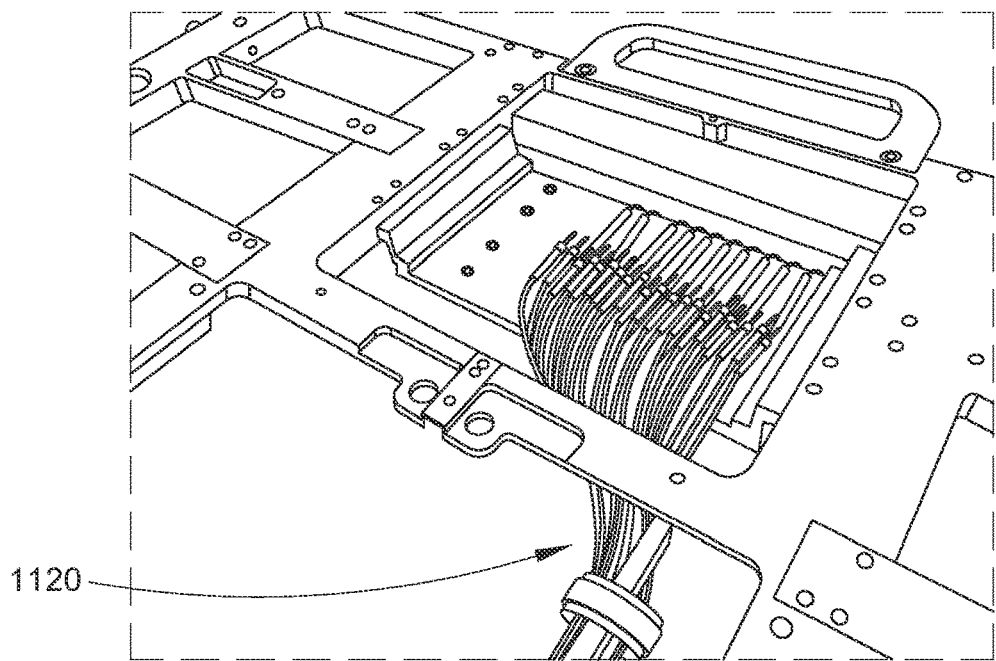
FIG. 11A shows a top view of an example of a load board without load board printed circuit board (PCB)
Figure 11B:
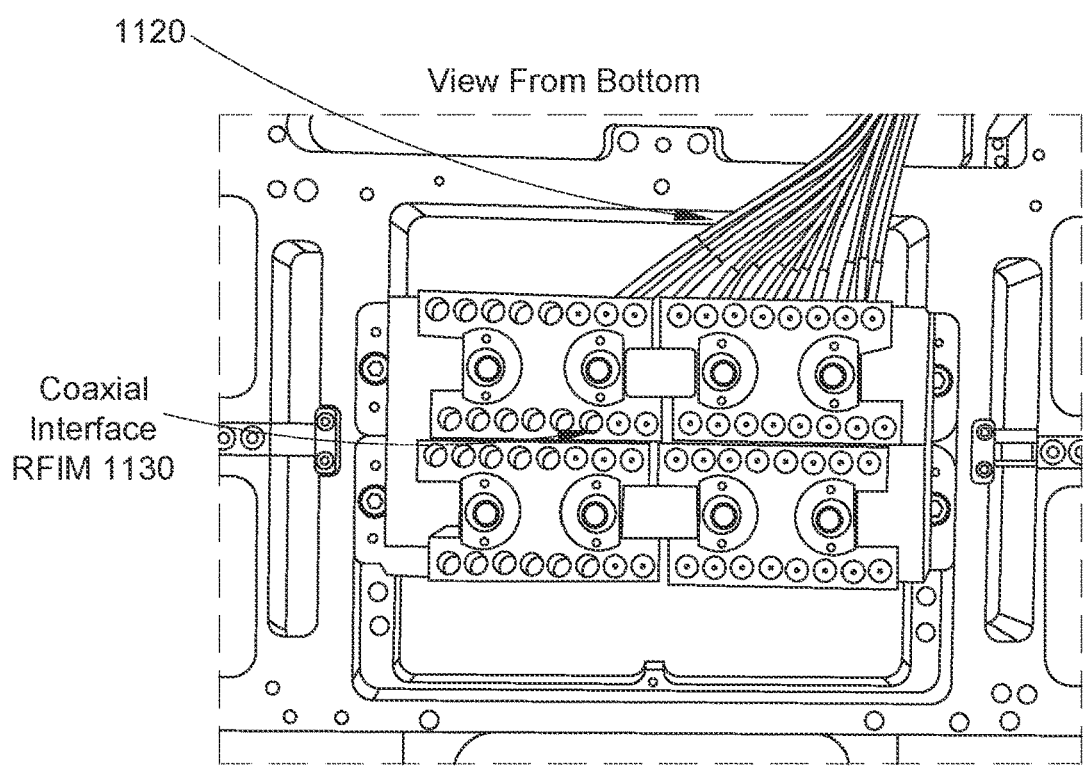
FIG. 11B shows a bottom view of an example of a load board.
Figure 11C:
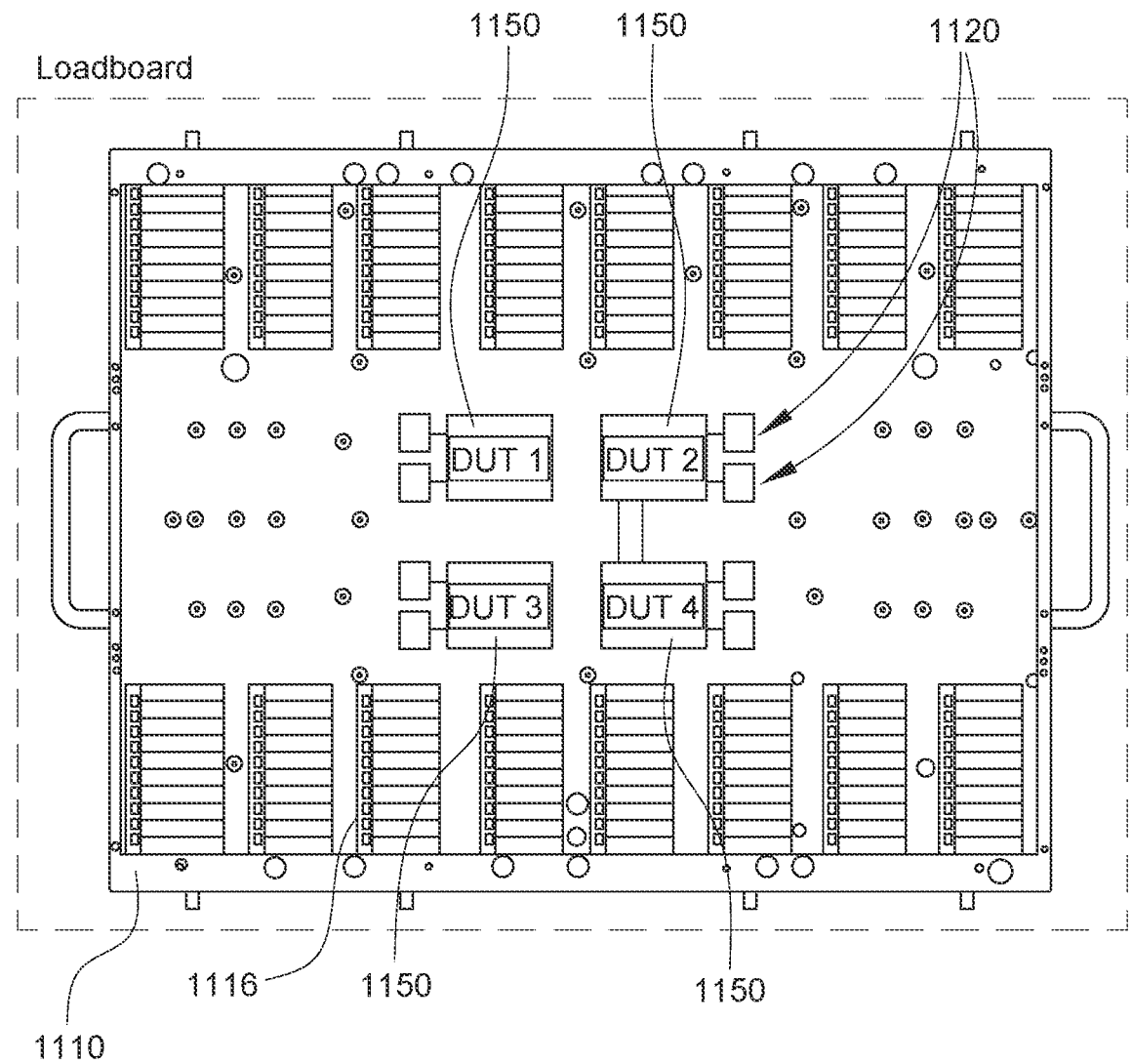
FIG. 11C shows a load board with load board PCB installed.

FIGS. 11A to 11C show views of an example of a load board 1110. The load board 1110 may comprise a load board frame, a coaxial interface and a load board printed circuit board (PCB). FIG. 11A shows a top view of the load board frame without the load board PCB, i.e. the load board PCT is not installed in FIG. 11A. The coaxial cables 1120 shown in FIG. 11A are connected to connectors on the load board PCB, which are close to a DUT.

FIG. 11B shows a bottom view of the load board 1110, when the load board PCB 1160 is not installed. The coaxial cables 1120 of FIG. 11B are connected to a coaxial interface 1130 of the load board 1110. The coaxial interface may be configured to be connected to a radio frequency interface module (RFIM), such as one of the radio frequency interface modules 950 shown in FIG. 9. The load board with an installed load board PCB 1160 is shown in FIG. 11C. DUTs are located in sockets on the other side of the load board PCB 1160. The positions of DUT sockets 1150 and connectors 1120 to the coaxial cables 1120 are marked in FIG. 11C.

According to the present teaching, a DUT loopback which permits connection of a DUT transmitter to a DUT receiver is provided in the ATE, i.e. not in the load board or the DUT itself. Thus, internal resources of the DUT may be used for self testing the DUT. Since the loopback is provided in the ATE, the load board does not need any change or additional components. In embodiments, the loopback and the features to implement the respective loop back path may be provided within a RFIM or a RF card of the ATE.

Although some aspects have been described as features in the context of an apparatus it is clear that such a description may also be regarded as a description of corresponding features of a method. Although some aspects have been described as features in the context of a method, it is clear that such a description may also be regarded as a description of corresponding features concerning the functionality of an apparatus.

In the description, it may be seen that various features are grouped together in embodiments for the purpose of streamlining the disclosure. This method of disclosure is not to be interpreted as reflecting an intention that the claimed embodiments require more features than are expressly recited in each claim. Rather, as the following claims reflect, inventive subject matter may lie in less than all features of a single disclosed embodiment. Thus, the following claims are hereby incorporated into the description, where each claim may stand on its own as a separate embodiment. While each claim may stand on its own as a separate embodiment, it is to be noted that, although a dependent claim may refer in the claims to a specific combination with one or more other claims, other embodiments may also include a combination of the dependent claim with the subject matter of each other dependent claim or a combination of each feature with other dependent or independent claims. Such combinations are proposed herein unless it is stated that a specific combination is not intended. Furthermore, it is intended to include also features of a claim to any other independent claim even if this claim is not directly made dependent to the independent claim.

The above described embodiments are merely illustrative for the principles of the present disclosure. It is understood that modifications and variations of the arrangements and the details described herein will be apparent to others skilled in the art. It is the intent, therefore, to be limited only by the scope of the pending patent claims and not by the specific details presented by way of description and explanation of the embodiments herein.

The invention claimed is:

1. An automated test equipment for testing a device under test the automated test equipment comprising:
a stimulus module; a measurement module; a loopback; a first switch; a second switch; and a load board interface wherein the load board interface comprises: a first radio frequency port; and a second radio frequency port,
wherein the first and second radio frequency ports are operable to be coupled to respective ports of a load board associated with the load board interface, wherein the device under test is operable to couple to the load board to receive and to provide test signals between the load board interface and the respective ports of the load board,
wherein further the first switch is operable to couple the first radio frequency port to the stimulus module when the first switch is set in a first switching state of the first switch,
wherein further the second switch is operable to couple the second radio frequency port to the measurement module when the second switch is set in a first switching state of the second switch, and
wherein further the first switch is operable to couple the first radio frequency port to a first end of the loopback when the first switch is set in a second switching state, and the second switch is operable to couple the second radio frequency port to a second end of the loopback when the second switch is set in a second switching state, wherein a loopback signal path is formed between the first and second radio frequency ports when the first and second switches are in the respective second switching state.

2. The automated test equipment according to claim 1, wherein the load board interface comprises pogo pins operable to connect digital and power supply pins to the load board.

3. The automated test equipment according to claim 1, wherein the first and second radio frequency ports are coaxial ports.

4. The automated test equipment according to claim 1, wherein the loopback comprises a transmission line coupling the first switch to the second switch.

5. The automated test equipment according to claim 1, wherein the loopback comprises at least one power adjusting element.

6. The automated test equipment according to claim 5, wherein the power adjusting element comprises at least one of an attenuator and an amplifier.

7. The automated test equipment according to claim 5, wherein the loopback is a first loopback carrying signal transmission between the first and second radio frequency ports in a first direction, and wherein the automated test equipment further comprises: a second loopback carrying signal transmission between the first and second radio frequency ports in a second direction opposite to the first direction, and wherein the first switch is operable to couple the first radio frequency port to a first end of the second loopback and when the first switch is set in a third switching state, and wherein the second switch is operable to couple the second radio frequency port to a second end of the second loopback when the second switch is set in a third switching state, and wherein a loopback signal path is formed between the first and second radio frequency ports when the first and second switches are set in the third switching state.

8. The automated test equipment according to claim 5, further comprising: a first coupler operable to couple part of a signal from a portion of the loopback signal path between the power adjusting element and the first radio frequency port to the measurement module, and a second coupler operable to couple part of a signal from a portion of the loopback signal path between the power adjusting element and the second radio frequency port to the measurement module.

9. The automated test equipment according to claim 8, further comprising a coupler switch operable to couple the first coupler to the measurement module.

10. The automated test system according to claim 8, further comprising a coupler switch operable to couple the second coupler to the measurement module.

11. The automated test equipment according to claim 1, further comprising: a coupler operable to couple part of a signal from the loopback signal path to the measurement module.

12. The automated test equipment according to claim 1, wherein the first switch is operable to couple the first radio frequency port to the measurement module when the first switch is set in a fourth switching state, and wherein the second switch is operable to couple the second radio frequency port to the stimulus module when the second switch is set in a fourth switching state.

13. The automated test equipment according to claim 12, further comprising: a third switch operable to couple the first switch to the stimulus module when the first switch is in the first switching state and to couple the second switch to the stimulus module when the second switch is in the fourth switching state, and a fourth switch operable to couple the second switch to the measurement module when the second switch is in the first switching state and operable to couple the first switch to the measurement module when the first switch is in the fourth switching state.

14. An automated test system for testing a device under test comprising:
a stimulus module; a measurement module; a loopback; a load board; a first switch; a second switch; and a load board interface, the load board interface comprising a first radio frequency port and a second radio frequency port, wherein the load board is configured to be mechanically and electrically docked to the load board interface, wherein the load board comprises at least one socket configured to connect to the device under test,
wherein the first and second radio frequency ports are configured to be coupled to respective ports of the load board, wherein the device under test is operable to couple to the load board via the socket to receive and to provide test signals between the load board interface and the respective ports of the load board,
wherein the first switch is operable to couple the first radio frequency port to the stimulus module when the first switch is set in a first switching state,
wherein the second switch is operable to couple the second radio frequency port to the measurement module when the second switch is set in a first switching state,
wherein further the first switch is operable to couple the first radio frequency port to a first end of the loopback when the first switch is set in a second switching state, and the second switch is operable to couple the second radio frequency port to a second end of the loopback when the second switch is set in a second switching state, wherein a loopback signal path is formed between the first and second radio frequency ports when the first and second switches are in the respective second switching state, and
wherein the socket is coupled to the first and second radio frequency ports via the load board.

15. The automated test equipment according to claim 14, wherein the load board interface comprises pogo pins operable to couple digital and power supply pins to the load board.

16. The automated test equipment according to claim 14, wherein the first and second radio frequency ports comprise coaxial ports.

17. The automated test equipment according to claim 14, wherein the loopback comprises a transmission line coupling the first switch to the second switch.

18. The automated test equipment according to claim 14, wherein the loopback comprises at least one power adjusting element.

19. An automated test system for testing a device under test comprising:
a stimulus module; a measurement module; a loopback; a load board; a first switch; a second switch; and a load board interface wherein the load board interface comprises a first radio frequency port and a second radio frequency port, and
wherein the first and second radio frequency ports are operable to be coupled to respective ports of the load board, wherein the device under test is operable to couple to the load board to receive and to provide test signals between the load board interface and the respective ports of the load board,
wherein the first switch is operable to couple the first radio frequency port to the stimulus module when the first switch is set in a first switching state,
wherein the second switch is operable to couple the second radio frequency port to the measurement module when the second switch is set in a first switching state,
wherein the first switch is operable to couple the first radio frequency port to a first end of the loopback when the first switch is set in a second switching state, and the second switch is operable to couple the second radio frequency port to a second end of the loopback when the second switch is set in a second switching state, wherein a loopback signal path is formed between the first and second radio frequency ports when the first and second switches are in the respective second switching state, and
wherein the load board is operable to be mechanically and electrically docked to the load board interface.

20. The automated test equipment according to claim 19, wherein the loopback comprises at least one power adjusting element.

21. The automated test equipment according to claim 20, wherein the loopback is a first loopback permitting signal transmission between the first and second radio frequency ports in a first direction, and further comprising: a second loopback permitting signal transmission between the first and second radio frequency ports in a second direction opposite to the first direction, wherein the first switch is operable to couple the first radio frequency port to a first end of the second loopback when the first switch is set in a third switching state, and the second switch is operable to couple the second radio frequency port to a second end of the second loopback when the second switch is set in a third switching state, and wherein the loopback signal path is formed between the first and second radio frequency ports when the first and second switches are in the respective third switching state.

* * * * *